(12) United States Patent
Zhu et al.

(10) Patent No.: US 9,844,163 B2
(45) Date of Patent: Dec. 12, 2017

(54) ELECTRONIC MODULE AND ELECTRONIC APPARATUS

(71) Applicant: Wistron Corporation, New Taipei (TW)

(72) Inventors: Chong-Xing Zhu, New Taipei (TW); Chia-Hsin Liu, New Taipei (TW); Zhi-Tao Yu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/182,611

(22) Filed: Jun. 15, 2016

(65) Prior Publication Data
US 2017/0202103 A1    Jul. 13, 2017

(30) Foreign Application Priority Data
Jan. 7, 2016  (CN) .......................... 2016 1 0011705

(51) Int. Cl.
*H05K 7/14* (2006.01)

(52) U.S. Cl.
CPC ......... *H05K 7/1491* (2013.01); *H05K 7/1487* (2013.01)

(58) Field of Classification Search
CPC .......... G06F 1/16; G06F 1/1679; G06F 1/187; G06F 1/183; G06F 1/1624; G11B 33/128;
(Continued)

(56) References Cited

U.S. PATENT DOCUMENTS

| 3,295,905 A * | 1/1967 | Sisk | H01R 35/02 174/69 |
| 3,647,936 A * | 3/1972 | Dryg | H02G 11/006 174/69 |

(Continued)

FOREIGN PATENT DOCUMENTS

| CN | 103187660 | 7/2013 |
| CN | 103729041 | 4/2014 |

(Continued)

OTHER PUBLICATIONS

"Office Action of Taiwan Counterpart Application," with English translation thereof, dated Jul. 13, 2017, p. 1-p. 10, in which the listed references were cited.

*Primary Examiner* — James Wu
*Assistant Examiner* — Michael Matey
(74) *Attorney, Agent, or Firm* — JCIPRNET

(57) ABSTRACT

An electronic module includes a base, a carrying structure, an electronic component and a cable. The carrying structure includes a carrying portion and a cable arranging portion. The carrying portion is slidably disposed in the base, the cable arranging portion is connected to the carrying portion, and at least a part of the cable arranging portion is adapted to be bent. The electronic component is carried on the carrying portion. The cable is connected between the electronic component and the base and is position-limited by the cable arranging portion. When the carrying portion at least partially slides out of the base, the cable is deformed with the cable arranging portion. In addition, an electronic apparatus having the electronic module is also provided.

22 Claims, 8 Drawing Sheets

(58) Field of Classification Search
CPC .. H01R 13/6275; H01R 31/06; H05K 5/0247; H05K 7/1491; H05K 1/028; H05K 5/00; H05K 5/03; H05K 5/069; H05K 7/1427; H05K 7/1487; E05D 11/0081; H04R 1/02; H04R 1/1033
See application file for complete search history.

(56) References Cited

U.S. PATENT DOCUMENTS

| | | | | |
|---|---|---|---|---|
| 6,305,556 | B1* | 10/2001 | Mayer | G06F 1/18 211/175 |
| 6,442,031 | B1* | 8/2002 | Liu | H05K 7/1421 312/334.1 |
| 7,859,850 | B2* | 12/2010 | Chan | G06K 7/0021 361/737 |
| 9,025,326 | B1 | 5/2015 | Xu | |
| 9,480,182 | B2* | 10/2016 | Chen | F16L 3/015 |
| 2003/0026084 | A1* | 2/2003 | Lauchner | H05K 7/1491 361/826 |
| 2007/0017883 | A1 | 1/2007 | Bridges et al. | |
| 2007/0227756 | A1* | 10/2007 | Doerr | H05K 7/1491 174/69 |
| 2007/0258212 | A1* | 11/2007 | Malone | H05K 7/1421 361/699 |
| 2011/0164374 | A1* | 7/2011 | Tai | H01R 13/72 361/679.33 |
| 2012/0193485 | A1* | 8/2012 | Yu | H05K 7/1491 248/68.1 |
| 2013/0171848 | A1 | 7/2013 | Gao | |
| 2014/0009893 | A1* | 1/2014 | Lai | H05K 7/1487 361/728 |
| 2015/0092340 | A1* | 4/2015 | Jau | G11B 33/128 361/679.39 |
| 2016/0150667 | A1* | 5/2016 | Xu | H05K 7/1489 361/679.4 |
| 2017/0079158 | A1* | 3/2017 | Yen | H05K 7/1489 |

FOREIGN PATENT DOCUMENTS

| | | |
|---|---|---|
| TW | M1381986 | 6/2010 |
| TW | I407878 | 9/2013 |
| TW | M504262 | 7/2015 |

* cited by examiner

ELECTRONIC MODULE AND ELECTRONIC APPARATUS

CROSS-REFERENCE TO RELATED APPLICATION

This application claims the priority benefit of China application serial no. 201610011705.2, filed on Jan. 7, 2016. The entirety of the above-mentioned patent application is hereby incorporated by reference herein and made a part of this specification.

BACKGROUND OF THE INVENTION

Field of the Invention

The invention relates to an electronic module and an electronic apparatus, and relates particularly to an electronic module and an electronic apparatus having a cable arranging function.

Description of Related Art

A server is a core for servicing each computer or portable electronic device in a network system. Generally speaking, the server is made up of a framework and a plurality of machine cases disposed in the framework. A basic configuration of each of the machine cases is similar to that of a personal computer and includes a central processing unit (CPU), a memory and an input output (I/O) device and such parts.

In order for other electronic devices to transfer data with the server wirelessly, a near field communication module is installed on the machine case of the some of the servers. The near field communication module typically is assembled on the machine case by a screw locking method, wherein this type of assembling method requires space for the screw locking and is unable to reduce a thickness of the near field communication module effectively, and a user is required to use tools (such as a screw driver) for disassembling the near field communication module. In addition, when the user pulls out or inserts a near field communication component in the near field communication module, cables connected between the near field communication components and the server are tangled easily causing operational inconvenience or resulting in function failure.

SUMMARY OF THE INVENTION

The invention provides an electronic module, which may have a smaller thickness and may prevent a cable from being tangled.

The invention provides an electronic apparatus, an electronic module thereof may have a smaller thickness and may prevent a cable from being tangled.

An electronic module includes a base, a carrying structure, an electronic component and a cable. The carrying structure includes a carrying portion and a cable arranging portion. The carrying portion is slidably disposed in the base, the cable arranging portion is connected to the carrying portion, and at least a part of the cable arranging portion is adapted to be bent. The electronic component is carried on the carrying portion. The cable is connected between the electronic component and the base and is position-limited by the cable arranging portion. When the carrying portion at least partially slides out of the base, the cable is deformed with the cable arranging portion.

In an embodiment of the invention, the aforementioned base has an electrical connection part, the cable is connected between the electronic component and the electrical connection part.

In an embodiment of the invention, the aforementioned electronic module is adapted to be installed at a main body of an electronic apparatus, wherein an interference between the main body and the base prevents the electronic module separating with the main body, the carrying structure has at least one elastic arm, the elastic arm is connected to the carrying portion, when the carrying portion at least partially slides out of the base, the elastic arm is adapted to receive a force to generate an elastic deformation and pushes against the main body, such that the interference between the main body and the base is removed.

In an embodiment of the invention, the elastic arm includes an elastic connection part and a pressing part, the elastic connection part is connected between the carrying portion and the pressing part, the pressing part is adapted to push against the main body by an elastic deformation of the elastic connection part.

An electronic apparatus of the invention includes a main body and an electronic module. The electronic module includes a base, a carrying structure, an electronic component and a cable. The base is installed at the main body. The carrying structure includes a carrying portion and a cable arranging portion, wherein the carrying portion is slidably disposed in the base, the cable arranging portion is connected to the carrying portion, and at least a part of the cable arranging portion is adapted to be bent. The electronic component is carried on the carrying portion. The cable is connected between the electronic component and the base and is position-limited by the cable arranging portion. The electronic component is electrically connected to the main body through the cable and the base. When the carrying portion at least partially slides out of the base, the cable is deformed with the cable arranging portion.

In an embodiment of the invention, the aforementioned base includes a bottom plate and a cover. The carrying portion is slidably disposed at the bottom plate, and the cover is engaged at the bottom plate and covers the carrying structure, the electronic component and the cable.

In an embodiment of the invention, the aforementioned bottom plate has at least one first slot, the cover has at least one engaging hook, the cover is adapted to move towards the bottom plate along a first axial direction, such that the engaging hook enters the first slot, and then moves along a second axial direction, such that the engaging hook interferes with the bottom plate, to prevent the cover moving with respect to the bottom plate along the first axial direction and a third axial direction, wherein the first axial direction, the second axial direction and the third axial direction are perpendicular to each other.

In an embodiment of the invention, the aforementioned bottom plate has at least one second slot, the cover has at least one elastic piece, when the cover moves towards the bottom plate along the first axial direction such that the engaging hook enters the first slot S1, the elastic piece is located out of the second slot, when the cover moves along the second axial direction such that the engaging hook interferes with the bottom plate, the elastic piece engages into the second slot to prevent the cover moving with respect to the bottom plate along the second axial direction, and when the cover is disassembled, the elastic piece is adapted to receive a force to generate an elastic deformation and move out of the second slot.

In an embodiment of the invention, the aforementioned cable arranging portion includes at least two cable arranging sections and at least one bending section, the bending section is connected between the two cable arranging sections, the cable is position-limited by the cable arranging portion to extend along the cable arranging sections and the bending section, the cable arranging sections are not adapted to be bent, and the bending section is adapted to be bent.

In an embodiment of the invention, the aforementioned bending section has a recessed portion, and the bending section is adapted to bend at the recessed portion.

In an embodiment of the invention, each of the aforementioned cable arranging sections has at least one buckling hook, and the cable is position-limited by the buckling hook.

In an embodiment of the invention, two ends of the aforementioned cable arranging portion are connected to the carrying portion and the base respectively.

In an embodiment of the invention, the aforementioned cable arranging portion has a positioning pillar, the base has a positioning hole, and the positioning pillar is positioned at the positioning hole.

In an embodiment of the invention, the aforementioned base includes at least one sliding slot, the carrying portion has at least one sliding block and is slidably disposed at the sliding slot by the sliding block.

In an embodiment of the invention, the aforementioned main body has at least one elastic stopper structure, an interference between the elastic stopper structure and the base prevents the electronic module separating with the main body, the carrying structure has at least one elastic arm, the elastic arm is connected to the carrying portion, when the carrying portion partially slides out of the base, the elastic arm is adapted to receive a force to generate an elastic deformation and pushes against the elastic stopper structure, such that the elastic stopper structure generates an elastic deformation and the interference between the elastic stopper structure and the base is removed.

In an embodiment of the invention, the aforementioned elastic arm includes an elastic connection part and a pressing part, the elastic connection part is connected between the carrying portion and the pressing part, and the pressing part is adapted to push against the elastic stopper structure by an elastic deformation of the elastic connection part.

In an embodiment of the invention, the aforementioned elastic stopper structure has a stopping part and a driven part which are stacked with each other, an interference between the stopping part and the base prevents the electronic module separating with the main body, and the elastic arm is adapted to push against the driven part, such that the elastic stopper structure generates an elastic deformation and an interference between the stopping part and the base is removed.

In an embodiment of the invention, an outer diameter of the aforementioned driven part is larger than an outer diameter of the stopping part.

Based on the above, an electronic module of the invention has a cable arranging portion, wherein the cable arranging portion is used to perform position-limitation of a cable. In this way, when a carrying portion and an electronic component on top thereof are pulled out of or are inserted to a base by a user, the cable connected between the electronic component and a main body of an electronic apparatus will not be tangled due to being position-limited by the cable arranging portion, such that operational inconvenience or function failure of the electronic module due to the tangled cable may be prevented. More specifically, since the cable arranging portion is designed such that at least a part is adapted to be bent, the carrying portion and the electronic component on top thereof may be pulled out or inserted to the base smoothly through the bending ability of the cable arranging portion. In addition, the base that is used to store the carrying structure, the electronic component and the cable may include a bottom plate and a cover, wherein the bottom plate and the cover are assembled by an engagement method and are not assembled together by a screw locking method. An installation design of the electronic module does not require space for screw locking to be provided and may reduce a thickness of the electronic module effectively. In addition, the user does not require using tools (such as a screw driver) for disassembling the electronic module.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
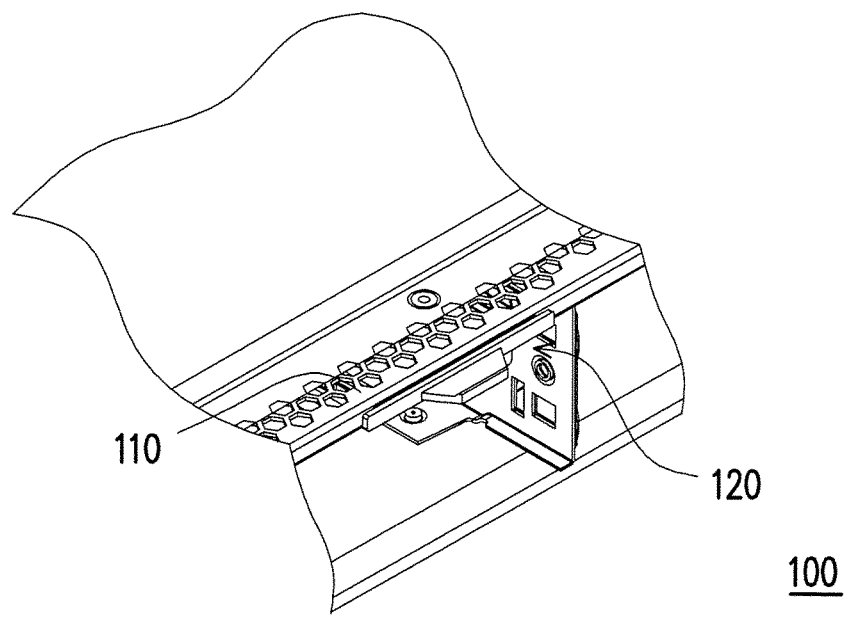
FIG. 1 is a partial three-dimensional diagram of an electronic apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
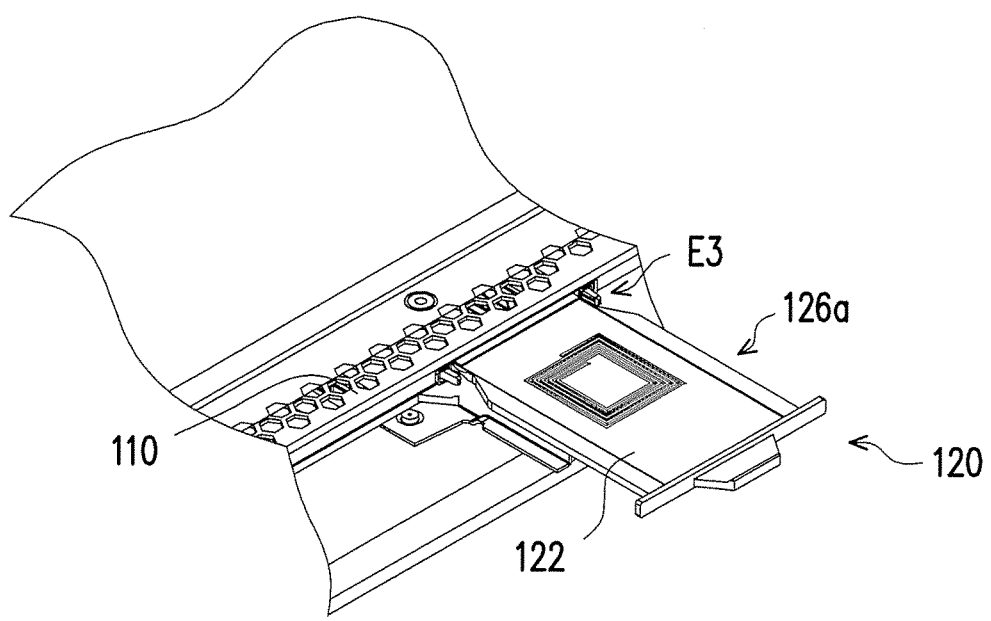
FIG. 2 illustrates an electronic component pulled out from a main body of the electronic apparatus of FIG. 1.

FIG. 1 is a partial three-dimensional diagram of an electronic apparatus according to an embodiment of the invention. FIG. 2 illustrates an electronic component pulled out from a main body of the electronic apparatus of FIG. 1. Referring to FIG. 1 and FIG. 2, an electronic apparatus 100 of the present embodiment, for example, is a server and includes a main body 110 and an electronic module 120. The main body 110, for example, is a machine case of the server and components which are inside the machine case. The electronic module 120, for example, is a near field communication (NFC) module and includes an electronic component 122, wherein the electronic component 122, for example, is a near field communication component. A user may pull out the electronic component 122 from the main body 110 as shown in FIG. 2, such that other electronic devices may transfer data with the electronic apparatus 100 through the electronic component 122 by a wireless method. In other embodiments, the electronic apparatus 100 may be another type of apparatus, and the electronic module 120 and the electronic component 122 may be another type of electronic module, and it should not be construed as a limitation to the invention.

Figure 3:
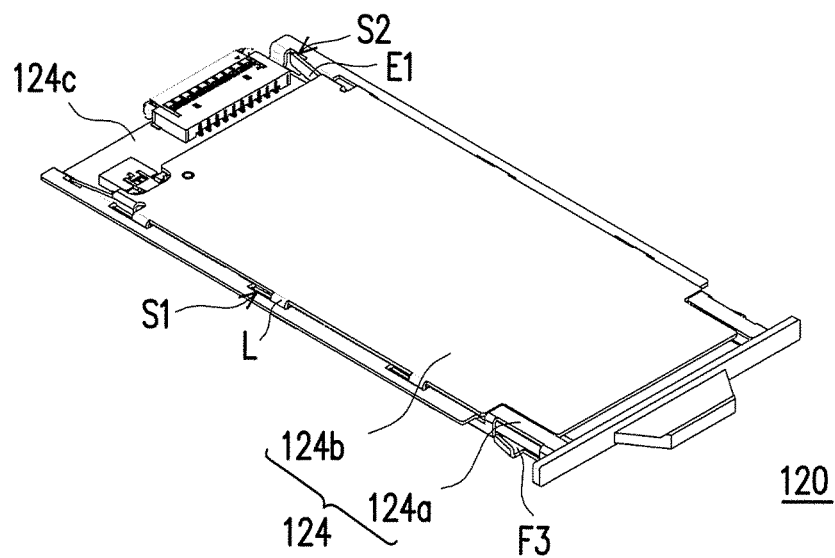
FIG. 3 is a three-dimensional diagram of an electronic module of FIG. 1.
Figure 4:
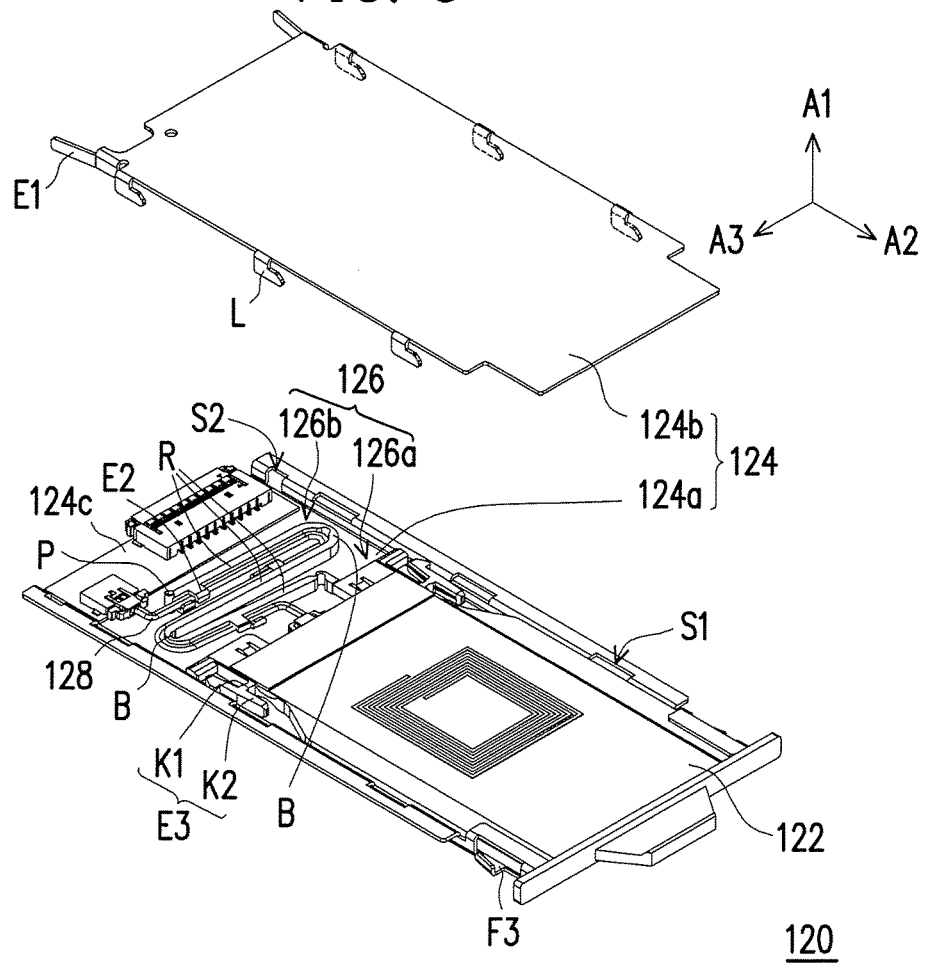
FIG. 4 is an exploded view of the electronic module of FIG. 3.

FIG. 3 is a three-dimensional diagram of an electronic module of FIG. 1. FIG. 4 is an exploded view of the electronic module of FIG. 3. Referring to FIG. 3 and FIG. 4, the electronic module 120 of the present embodiment further includes a base 124, a carrying structure 126 and a cable 128. The base 124 is installed on the main body 110 shown in FIG. 1. The carrying structure 126 includes a carrying portion 126a and a cable arranging portion 126b. The carrying portion 126a is slidably disposed in the base 124, the cable arranging portion 126b is connected to the carrying portion 126a, and at least a part of the cable arranging portion 126b is adapted to be bent. The electronic component 122 is carried on the carrying portion 126a. The cable 128 is connected between the electronic component 122 and an electrical connection part 124c that is on the base 124 and is position-limited by the cable arranging portion 126b. The electronic component 122 is electrically connected to the main body 110 shown in FIG. 1 through the cable 128 and the electrical connection part 124c that is on the base 124.

Figure 5:
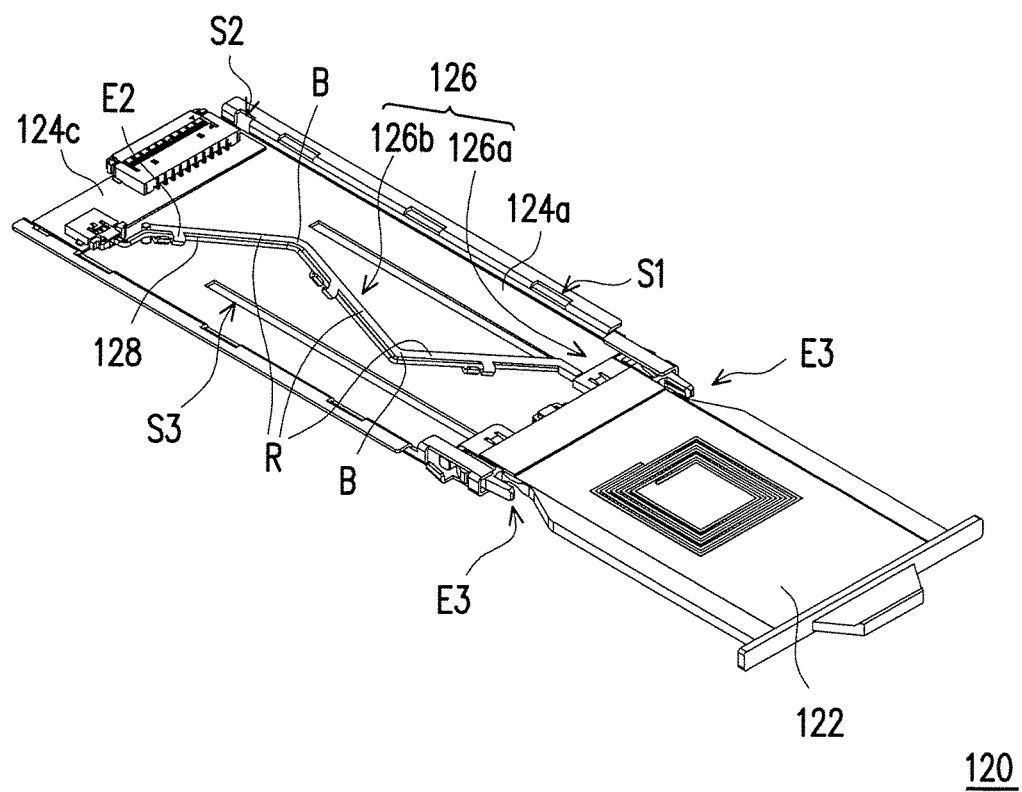
FIG. 5 illustrates a carrying portion and an electronic component of FIG. 4 moved out of a base.

FIG. 5 illustrates a carrying portion and an electronic component of FIG. 4 moved out of a base. As shown in FIG. 5, when the carrying portion 126a at least partially slides out of the base 124 (labelled in FIG. 3 and FIG. 4), the cable 128 will change shape along the cable arranging portion 126b. By this type of design method, when the carrying portion 126a and the electronic component 122 on top thereof are pulled out of or are inserted to the base 124 by the user, the cable 128 connected between the electronic component 122 and the main body 110 (labelled in FIG. 1) of the electronic apparatus 100 will not be tangled due to being position-limited by the cable arranging portion 126b, such that operational inconvenience or function failure of the electronic module 120 due to the tangled cable 128 may be prevented. More specifically, since the cable arranging portion 126b is designed such that at least a part is adapted to be bent, the carrying portion 126a and the electronic component 122 on top thereof may be pulled out or inserted to the base 124 smoothly through the bending ability of the cable arranging portion 126b.

Figure 6:
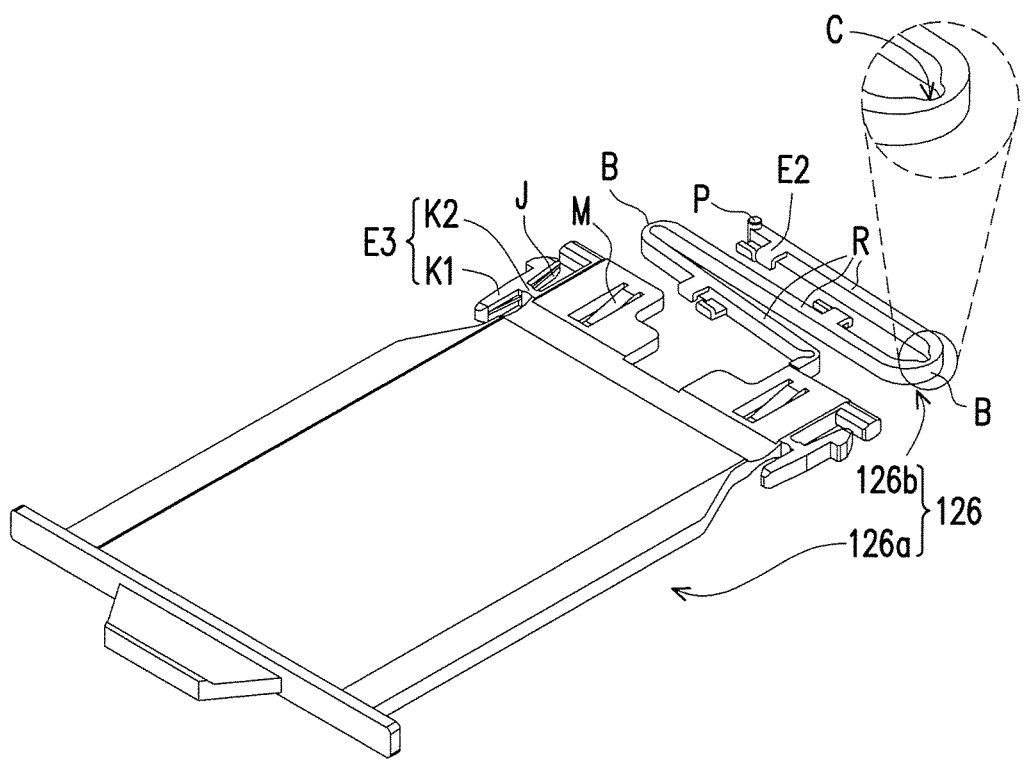
FIG. 6 is a three-dimensional diagram of a carrying structure of FIG. 4.

FIG. 6 is a three-dimensional diagram of a carrying structure of FIG. 4. Referring to FIG. 4, FIG. 5 and FIG. 6, more specifically, the cable arranging portion 126b of the present embodiment includes at least two cable arranging sections R (three are shown) and at least one bending section B (two are illustrated), wherein each of the bending sections B is connected between two of the adjacent cable arranging sections R, and the cable 128 is position-limited by the cable arranging portion 126b to extend along the cable arranging sections R and the bending sections B. Each of the cable arranging sections R is designed with no bend and each of the bending sections B is designed to bend. For example, as shown in FIG. 6, a recessed portion C is formed at each of the bending sections B to lower the structural strength of each of the bending sections B suitably, such that each of the bending sections B is adapted to produce a bend at the recessed portion C. In other embodiments, the cable arranging portion 126b may be formed as only a partially bendable structure by other suitable structural design methods or material selection methods, and the invention is not limited hereto. In the present embodiment, each of the cable arranging sections R has at least one buckling hook E2, wherein the cable 128 is position-limited by the buckling hook E2. However, it should not be construed as a limitation to the invention. In other embodiments, the cable 128 may be position-limited by each of the bending sections B by other suitable structures.

In the present embodiment, two of the ends of the cable arranging portion 126b are connected to the carrying portion 126a and the base 124 respectively. More specifically, the cable arranging portion 126b has a positioning pillar P, and the base has a positioning hole H (labelled in FIG. 7A and FIG. 7B). In addition, the positioning pillar P is positioned at the positioning hole H. In other embodiments, one of the ends of the cable arranging portion 126b may be positioned at the base 124 by other suitable structures and the invention is not limited hereto.

Referring to FIG. 3 and FIG. 4, in the present embodiment, the base 124 includes a bottom plate 124a and a cover 124b. The carrying portion 126a is slidably disposed at the bottom plate 124a, and the cover 124b is engaged at the bottom plate 124a and covers the carrying structure 126, the electronic component 122 and the cable 128. Since the bottom plate 124a and the cover 124b are not assembled together by a screw locking method, an installation design of the electronic module 120 does not require space for screw locking to be provided and may reduce a thickness of the electronic module 120 effectively. In addition, the user does not require using tools (such as a screw driver) for disassembling the electronic module 120.

Figure 7A:
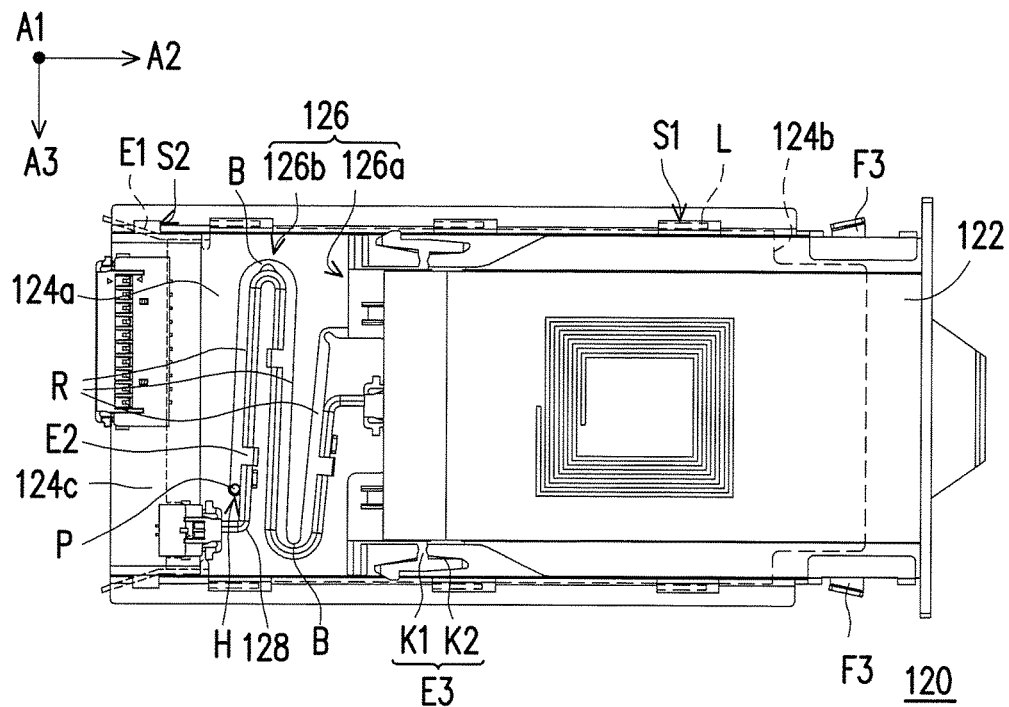
FIG. 7A and FIG. 7B illustrate a method for assembling a bottom plate and a cover of FIG. 4.
Figure 7B:
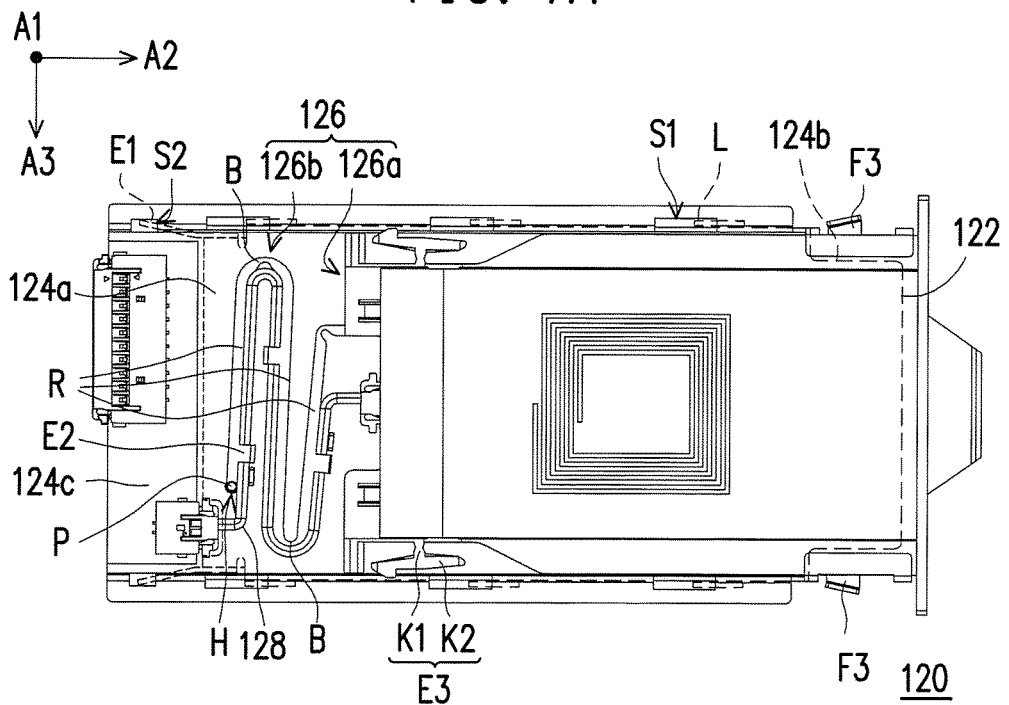

FIG. 7A and FIG. 7B illustrate a method for assembling a bottom plate and a cover of FIG. 4. Referring to FIG. 4, FIG. 7A and FIG. 7B, more specifically, the bottom plate 124a has at least one first slot S1 (a plurality are illustrated), and the cover 124b has at least one engaging hook L (a plurality are illustrated). The cover 124b is adapted to move towards the bottom plate 124a along a first axial direction A1, such that each of the engaging hooks L enters the corresponding first slot S1, as shown in FIG. 7A, and then move along a second axial direction A2, such that each of the engaging hooks L interferes with the bottom plate 124a, as shown in FIG. 7B to prevent the cover 124b moving with respect to the bottom plate 124a along the first axial direction A1 and a third axial direction A3, wherein the first axial direction A1, the second axial direction A2 and the third axial direction A3 are perpendicular to each other.

In addition, the bottom plate 124a has at least one second slot S2 (two are illustrated), and the cover 124b has at least one elastic piece E1 (two are illustrated). As aforementioned, when the cover 124b moves towards the bottom plate 124a along the first axial direction A1 such that each of the engaging hooks L enters the corresponding first slot S1, each of the elastic pieces E1 are located out of the corresponding second slot S2. When the cover 124b moves along the second axial direction A2 such that each of the engaging hooks L interferes with the bottom plate 124a as shown in FIG. 7B, each of the elastic pieces E1 will engage into the corresponding second slot S2 as shown in FIG. 7B to prevent the cover 124b moving with respect to the bottom plate 124a along the second axial direction A2. When the user desires to disassemble the cover 124b, the two of the elastic pieces E1 may be pressed along a direction opposite to the third axial direction A3 respectively, such that each of the elastic pieces E1 receives a force to generate an elastic deformation and moves out of the corresponding second slot S2. When each of the elastic pieces E1 is moved out of the corresponding second slot S2, the cover 124b may move along the second axial direction A2 from a location shown in FIG. 7B to a location shown in FIG. 7A, such that the interference between each of the engaging hooks L and the bottom plate 124a is removed, and the cover 124b may be separated with the bottom plate 124a along the first axial direction A1.

Figure 8:
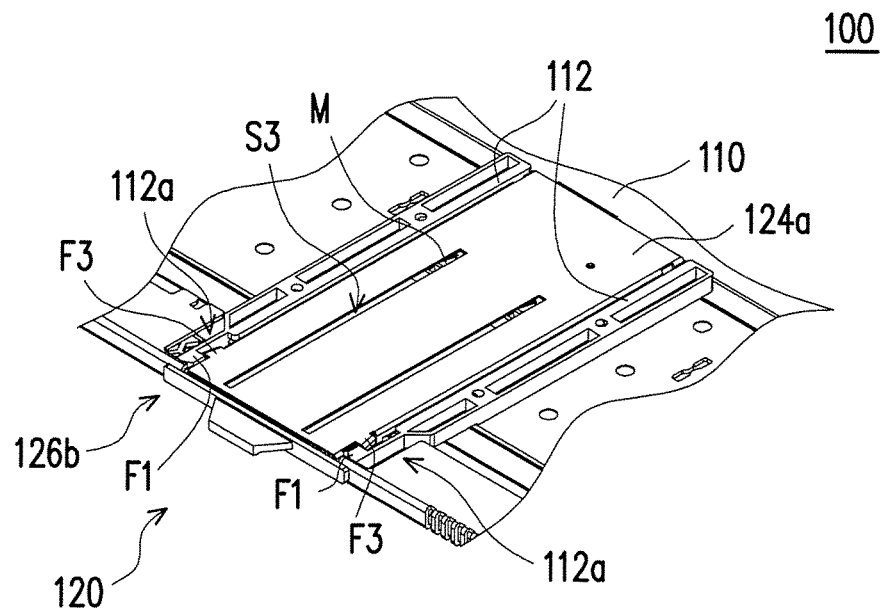
FIG. 8 illustrates a partial structure of the electronic apparatus of FIG. 1.

FIG. 8 illustrates a partial structure of the electronic apparatus of FIG. 1. Referring to FIG. 6 and FIG. 8, the bottom plate 124a of the base 124 in the present embodiment includes at least one sliding slot S3 (two are illustrated), and the carrying portion 126a of the carrying structure 126 includes at least one sliding block M and is slidably disposed at the sliding slot S3 by the sliding block M. In other embodiments, the carrying portion 126a may be slidably disposed at the bottom plate 124a by other suitable methods and invention is not limited hereto.

Figure 9:
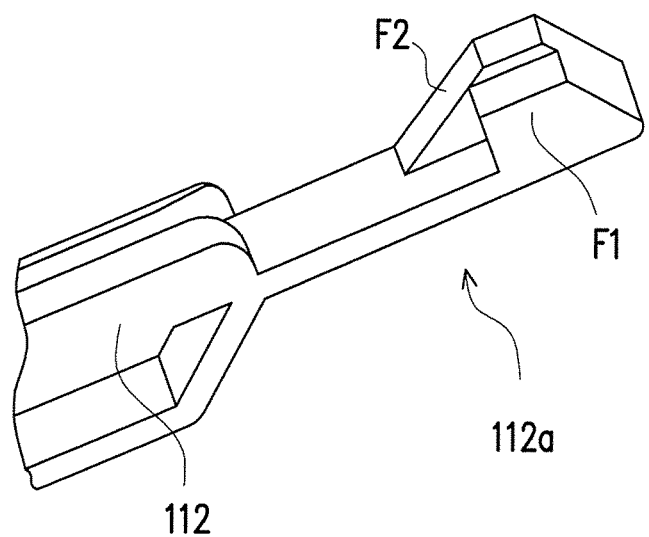
FIG. 9 illustrates a partial structure of a sliding rail of FIG. 8.

FIG. 9 illustrates a partial structure of a sliding rail of FIG. 8. Referring to FIG. 8 and FIG. 9, the electronic module 120 of the present embodiment is installed at a sliding rail 112 on the main body 110, wherein each of the sliding rails on the main body 110 has an elastic stopper structure 112a. The interference between the elastic stopper structure 112a and the bottom plate 124 of the base 124 (labelled in FIG. 3) prevents the electronic module 120 separating with the main body 110.

Figure 10:
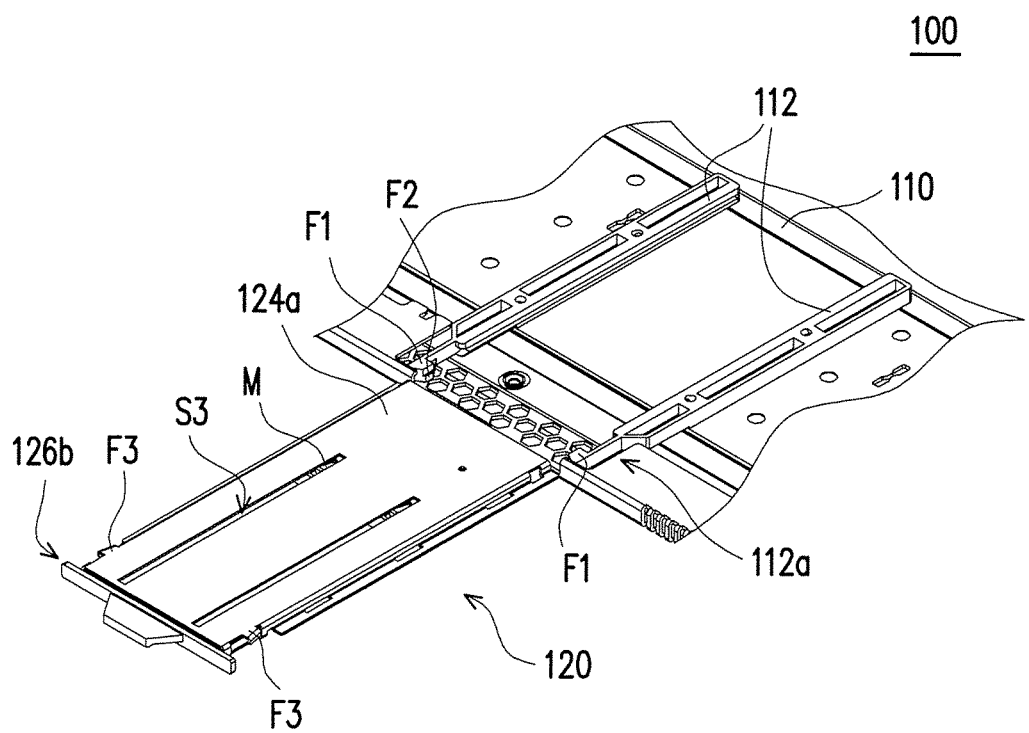
FIG. 10 illustrates an electronic module of FIG. 8 located out of the main body.

FIG. 10 illustrates an electronic module of FIG. FIG. 8 located out of the main body. When the user desires to install the electronic module 120 to the main body 110 of the electronic apparatus 100, the electronic module 120 may be first aligned to the sliding rail 112 that is on the main body 110 as shown in FIG. 10, then the electronic module 120 may be pushed in towards the main body 110 along the sliding rail 112. During the process, the elastic stopper structure 112a will be stretched open by the electronic module 120. When the electronic module 120 is assembled into place as shown in FIG. 8, the elastic stopper structure 112a will restore a position and stop the bottom plate 124a of the base 124. More specifically, the elastic stopper structure 112a has a stopping part F1 and a driven part F2 which are stacked with each other, wherein an interference between the stopping part F1 and a stopping part F3 on the bottom plate 124a of the base 124 prevents the electronic module 120 separating with the main body 110. A method of operating the driven part F2 is as described below.

Figure 11:
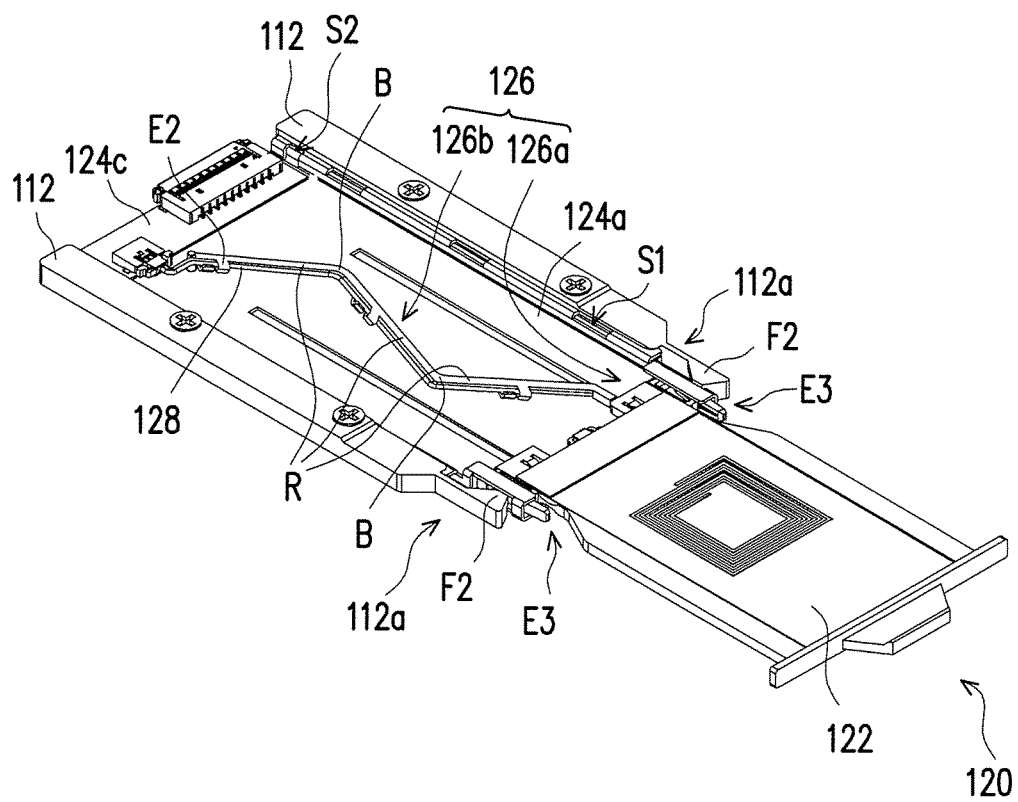
FIG. 11 illustrates a partial structure of the electronic apparatus of FIG. 2.

FIG. 11 illustrates a partial structure of the electronic apparatus of FIG. 2. Referring to FIG. 6 and FIG. 11, the carrying structure 126 of the present embodiment includes at least one elastic arm E3 (two are illustrated), wherein the elastic arm E3 is connected to the carrying portion 126a. When the user desires to disassemble the electronic module 120 from the main body 110, first, the carrying portion 126a may be pulled such that the carrying portion 126a slides out of the base 124 (labelled in FIG. 3) as shown in FIG. 11. Next, the user may apply a force to the elastic arm E3 such that the elastic arm E3 receives a force and generates an elastic deformation and pushes against the driven part F2 of the elastic stopper structure 112a, such that the elastic stopper structure 112a generates an elastic deformation and the interference between the stopping part F1 (illustrated in FIG. 9) of the elastic stopper structure 112a and the base 124 is removed. In the present embodiment, an outer diameter of the driven part F2 is larger than an outer diameter of the stopping part F1, as shown in FIG. 9. Therefore, the elastic arm E3 only requires a smaller elastic deformation amount to push the driven part F2 such that the stopping part F1 separates with the base 124.

Referring to FIG. 6, more specifically, the elastic arm E3 of the present embodiment includes an elastic connection part K1 and a pressing part K2. The elastic connection part K1 is connected between the carrying portion 126a and the pressing part K2, wherein the pressing part K2 is adapted to push against the elastic stopper structure 112a shown in FIG. 11 by the elastic deformation of the elastic connection part K1. Namely, the pressing part K2 itself is not required to have the ability to elastically deform. Therefore, the pressing part K2 design may have higher structural strength. For example, a structure strengthening rib J may be formed on the pressing part K2 as shown in FIG. 6.

In summary, an electronic module of the invention has a cable arranging portion, wherein the cable arranging portion is used to perform position-limitation of a cable. In this way, when a carrying portion and an electronic component on top thereof are pulled out of or are inserted to a base by a user, the cable connected between the electronic component and a main body of an electronic apparatus will not be tangled due to being position-limited by the cable arranging portion, such that operational inconvenience or function failure of the electronic module due to the tangled cable may be prevented. More specifically, since the cable arranging portion is designed such that at least a part is adapted to be bent, the carrying portion and the electronic component on top thereof may be pulled out or inserted to the base smoothly through the bending ability of the cable arranging portion. In addition, the base that is used to store the carrying structure, the electronic component and the cable may include a bottom plate and a cover, wherein the bottom plate and the cover are assembled by an engagement method and are not assembled together by a screw locking method. An installation design of the electronic module does not require space for screw locking to be provided and may reduce a thickness of the electronic module effectively. In addition, the user does not require using tools (such as a screw driver) for disassembling the electronic module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. An electronic module, comprising:
 a base;
 a carrying structure, comprising a carrying portion and a cable arranging portion, wherein the carrying portion is slidably disposed in the base, the cable arranging portion is connected to the carrying portion, and at least a part of the cable arranging portion is adapted to be bent;
 an electronic component, carried on the carrying portion; and
 a cable, connected between the electronic component and the base and is position-limited by the cable arranging portion, wherein when the carrying portion at least partially slides out of the base, the cable is deformed with the cable arranging portion,
 wherein the base comprises a bottom plate and a cover, the carrying portion is slidably disposed at the bottom plate, and the cover is engaged at the bottom plate via a screwless locking method and entirely covers the carrying structure, the electronic component and the cable,
 wherein the bottom plate has at least one first slot, the cover has at least one engaging hook, and the cover is adapted to move towards the bottom plate along a first axial direction, such that the engaging hook enters the first slot, and then moves along a second axial direction, such that the engaging hook interferes with the bottom plate, to prevent the cover moving with respect to the bottom plate along the first axial direction and a third axial direction, wherein the first axial direction, the second axial direction and the third axial direction are perpendicular to each other.

2. The electronic module as claimed in claim 1, wherein the bottom plate has at least one second slot, the cover has at least one elastic piece, when the cover moves towards the bottom plate along the first axial direction such that the engaging hook enters the first slot, the elastic piece is located out of the second slot, when the cover moves along the second axial direction such that the engaging hook interferes with the bottom plate, the elastic piece engages into the second slot to prevent the cover moving with respect to the bottom plate along the second axial direction, and when the cover is disassembled, the elastic piece is adapted to receive a force to generate an elastic deformation and move out of the second slot.

3. The electronic module as claimed in claim 1, wherein the cable arranging portion comprises at least two cable arranging sections and at least one bending section, the bending section is connected between the two cable arranging sections, the cable is position-limited by the cable arranging portion to extend along the cable arranging sections and the bending section, the cable arranging sections are not adapted to be bent, and the bending section is adapted to be bent.

4. The electronic module as claimed in claim 3, wherein the bending section has a recessed portion, and the bending section is adapted to bend at the recessed portion.

5. The electronic module as claimed in claim 3, wherein each of the cable arranging sections has at least one buckling hook, and the cable is position-limited by the buckling hook.

6. The electronic module as claimed in claim 1, wherein two ends of the cable arranging portion are connected to the carrying portion and the base respectively.

7. The electronic module as claimed in claim 6, wherein the cable arranging portion has a positioning pillar, the base has a positioning hole, and the positioning pillar is positioned at the positioning hole.

8. The electronic module as claimed in claim 1, wherein the base comprises at least one sliding slot, the carrying portion has at least one sliding block and is slidably disposed at the sliding slot by the sliding block.

9. The electronic module as claimed in claim 1, adapted to be installed at a main body of an electronic apparatus, wherein an interference between the main body and the base prevents the electronic module separating with the main body, the carrying structure has at least one elastic arm, the elastic arm is connected to the carrying portion, when the carrying portion at least partially slides out of the base, the elastic arm is adapted to receive a force to generate an elastic deformation and pushes against the main body, such that the interference between the main body and the base is removed.

10. The electronic module as claimed in claim 9, wherein the elastic arm comprises an elastic connection part and a pressing part, the elastic connection part is connected between the carrying portion and the pressing part, the pressing part is adapted to push against the main body by an elastic deformation of the elastic connection part.

11. An electronic apparatus, comprising:
a main body; and
an electronic module, comprising:
  a base, installed at the main body;
  a carrying structure, comprising a carrying portion and a cable arranging portion, wherein the carrying portion is slidably disposed in the base, the cable arranging portion is connected to the carrying portion, and at least a part of the cable arranging portion is adapted to be bent;
  an electronic component, carried on the carrying portion; and
  a cable, connected between the electronic component and the base and is position-limited by the cable arranging portion, wherein the electronic component is electrically connected to the main body through the cable and the base, and when the carrying portion at least partially slides out of the base, the cable is deformed with the cable arranging portion,
  wherein the base comprises a bottom plate and a cover, and the carrying portion is slidably disposed at the bottom plate, the cover is engaged at the bottom plate via a screwless locking method and entirely covers the carrying structure, and the electronic component and the cable,
wherein the bottom plate has at least one first slot, the cover has at least one engaging hook, and the cover is adapted to move towards the bottom plate along a first axial direction, such that the engaging hook enters the first slot, and then moves along a second axial direction, such that the engaging hook interferes with the bottom plate, to prevent the cover moving with respect to the bottom plate along the first axial direction and a third axial direction, wherein the first axial direction, the second axial direction and the third axial direction are perpendicular to each other.

12. The electronic apparatus as claimed in claim 11, wherein the bottom plate has at least one second slot, the cover has at least one elastic piece, when the cover moves towards the bottom plate along the first axial direction such that the engaging hook enters the first slot, the elastic piece is located out of the second slot, when the cover moves along the second axial direction such that the engaging hook interferes with the bottom plate, the elastic piece engages into the second slot to prevent the cover moving with respect to the bottom plate along the second axial direction, and when the cover is disassembled, the elastic piece is adapted to receive a force to generate an elastic deformation and move out of the second slot.

13. The electronic apparatus as claimed in claim 11, wherein the cable arranging portion comprises at least two cable arranging sections and at least one bending section, the bending section is connected between the two cable arranging sections, the cable is position-limited by the cable arranging portion to extend along the cable arranging sections and the bending section, the cable arranging sections are not adapted to be bent, and the bending section is adapted to be bent.

14. The electronic apparatus as claimed in claim 13, wherein the bending section has a recessed portion, and the bending section is adapted to bend at the recessed portion.

15. The electronic apparatus as claimed in claim 13, wherein each of the cable arranging sections has at least one buckling hook, and the cable is position-limited by the buckling hook.

16. The electronic apparatus as claimed in claim 11, wherein two ends of the cable arranging portion are connected to the carrying portion and the base respectively.

17. The electronic apparatus as claimed in claim 16, wherein the cable arranging portion has a positioning pillar, the base has a positioning hole, and the positioning pillar is positioned at the positioning hole.

18. The electronic apparatus as claimed in claim 11, wherein the base comprises at least one sliding slot, the carrying portion has at least one sliding block and is slidably disposed at the sliding slot by the sliding block.

19. The electronic apparatus as claimed in claim 11, wherein the main body has at least one elastic stopper structure, an interference between the elastic stopper structure and the base prevents the electronic module separating with the main body, the carrying structure has at least one elastic arm, the elastic arm is connected to the carrying portion, when the carrying portion partially slides out of the base, the elastic arm is adapted to receive a force to generate an elastic deformation and pushes against the elastic stopper structure, such that the elastic stopper structure generates an elastic deformation and the interference between the elastic stopper structure and the base is removed.

20. The electronic apparatus as claimed in claim 19, wherein the elastic arm comprises an elastic connection part and a pressing part, the elastic connection part is connected between the carrying portion and the pressing part, and the pressing part is adapted to push against the elastic stopper structure by an elastic deformation of the elastic connection part.

21. The electronic apparatus as claimed in claim 19, wherein the elastic stopper structure has a stopping part and a driven part which are stacked with each other, an interference between the stopping part and the base prevents the electronic module separating with the main body, and the elastic arm is adapted to push against the driven part, such that the elastic stopper structure generates an elastic deformation and an interference between the stopping part and the base is removed.

22. The electronic apparatus as claimed in claim 21, wherein an outer diameter of the driven part is larger than an outer diameter of the stopping part.

\* \* \* \* \*